US008067256B2

(12) United States Patent
Houle et al.

(10) Patent No.: US 8,067,256 B2
(45) Date of Patent: Nov. 29, 2011

(54) METHOD OF MAKING MICROELECTRONIC PACKAGE USING INTEGRATED HEAT SPREADER STIFFENER PANEL AND MICROELECTRONIC PACKAGE FORMED ACCORDING TO THE METHOD

(75) Inventors: Sabina J. Houle, Phoenix, AZ (US); James P. Mellody, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 735 days.

(21) Appl. No.: 11/864,279

(22) Filed: Sep. 28, 2007

(65) Prior Publication Data
US 2009/0085195 A1 Apr. 2, 2009

(51) Int. Cl.
*H01L 21/00* (2006.01)
(52) U.S. Cl. ............ 438/33; 438/68; 438/113; 438/114; 438/458; 438/460
(58) Field of Classification Search .................. None
See application file for complete search history.

(56) References Cited

U.S. PATENT DOCUMENTS

| 6,131,795 | A * | 10/2000 | Sato ............................. 228/102 |
| 6,232,152 | B1 * | 5/2001 | DiStefano et al. ............ 438/124 |
| 6,266,197 | B1 * | 7/2001 | Glenn et al. .................. 359/819 |
| 6,458,626 | B1 * | 10/2002 | Huang et al. .................. 438/112 |
| 6,720,647 | B2 * | 4/2004 | Fukuizumi .................... 257/704 |
| 6,734,552 | B2 * | 5/2004 | Combs et al. ................. 257/707 |
| 6,848,610 | B2 | 2/2005 | Liu |
| 6,979,894 | B1 * | 12/2005 | Sutardja ....................... 257/686 |
| 6,995,463 | B1 * | 2/2006 | Sutardja ....................... 257/686 |
| 7,015,072 | B2 * | 3/2006 | Combs et al. ................. 438/122 |
| 2003/0164549 | A1 * | 9/2003 | Nakayama .................... 257/777 |
| 2004/0012099 | A1 * | 1/2004 | Nakayama .................... 257/787 |
| 2005/0124140 | A1 * | 6/2005 | Mulligan ...................... 438/460 |
| 2005/0161806 | A1 * | 7/2005 | Divakar et al. ............... 257/717 |
| 2005/0236378 | A1 * | 10/2005 | Boyle et al. ............. 219/121.67 |
| 2006/0038282 | A1 * | 2/2006 | Lange .......................... 257/706 |
| 2006/0125088 | A1 * | 6/2006 | Huang et al. .................. 257/707 |
| 2006/0172457 | A1 * | 8/2006 | Huang .......................... 438/106 |
| 2006/0231944 | A1 * | 10/2006 | Huang et al. .................. 257/706 |
| 2007/0023486 | A1 * | 2/2007 | Matsuura et al. .......... 228/179.1 |
| 2008/0191359 | A1 * | 8/2008 | Koller et al. .................. 257/773 |
| 2008/0251903 | A1 * | 10/2008 | Otremba et al. .............. 257/678 |

(Continued)

FOREIGN PATENT DOCUMENTS
JP 11214596 A * 8/1999
(Continued)

*Primary Examiner* — David Graybill
(74) *Attorney, Agent, or Firm* — Blakely, Sokoloff, Taylor & Zafman LLP

(57) ABSTRACT

A method of making a microelectronic package, and a microelectronic package made according to the method. The method includes: bonding and thermally coupling a plurality of IC dies to an IHS panel to yield a die-carrying IHS panel; mounting the die-carrying IHS panel onto a substrate panel including a plurality of package substrates to yield a combination including the die-carrying IHS panel mounted to the substrate panel; and singulating the combination to yield a plurality of microelectronic packages, each of the packages including: an IHS component of the IHS panel, one of the plurality IC dies bonded and thermally coupled to said IHS component and one of the plurality of package substrates, said IHS component and said one of the plurality of IC dies being mounted to said one of the plurality of package substrates to form said each of the packages.

10 Claims, 3 Drawing Sheets

U.S. PATENT DOCUMENTS

| | | | |
|---|---|---|---|
| 2008/0305584 A1* | 12/2008 | Foong et al. | 438/122 |
| 2009/0093089 A1* | 4/2009 | Huang et al. | 438/122 |
| 2009/0194868 A1* | 8/2009 | Chong et al. | 257/712 |
| 2009/0227070 A1* | 9/2009 | Miyajima | 438/113 |
| 2009/0227071 A1* | 9/2009 | Otremba et al. | 438/113 |
| 2010/0001291 A1* | 1/2010 | Otremba et al. | 257/77 |
| 2010/0039777 A1* | 2/2010 | Houle et al. | 361/718 |
| 2010/0052156 A1* | 3/2010 | Appelt et al. | 257/712 |
| 2010/0079957 A1* | 4/2010 | Houle et al. | 361/709 |

FOREIGN PATENT DOCUMENTS

| | | |
|---|---|---|
| JP | 2008130706 A * | 6/2008 |

* cited by examiner

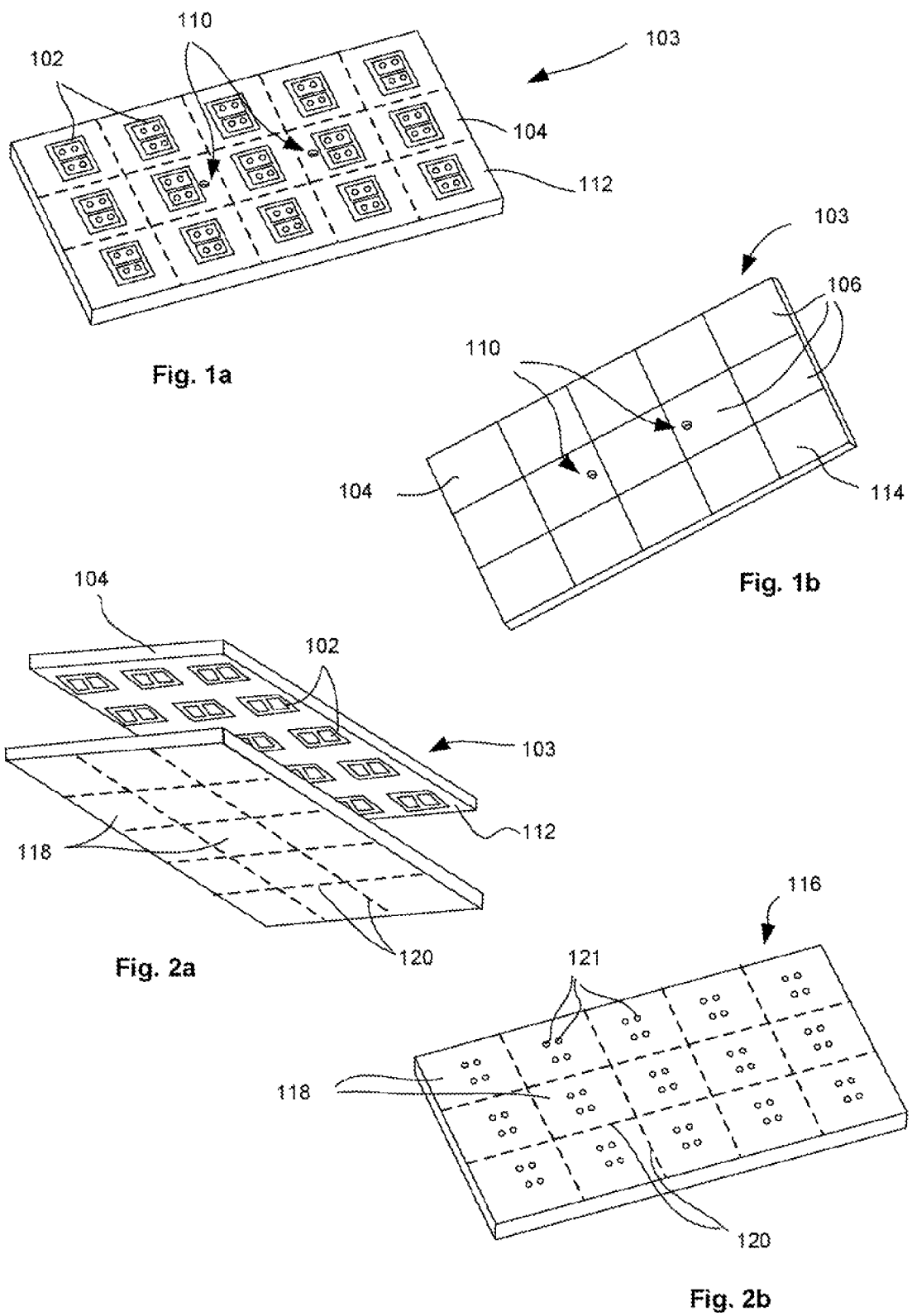

US 8,067,256 B2

METHOD OF MAKING MICROELECTRONIC PACKAGE USING INTEGRATED HEAT SPREADER STIFFENER PANEL AND MICROELECTRONIC PACKAGE FORMED ACCORDING TO THE METHOD

FIELD

The present invention relates to methods of fabricating microelectronic packages, and especially to methods of fabricating microelectronic packages having thin or no-core substrates.

BACKGROUND

As microelectronic components shrink in size, a trend has emerged to provide package substrates that may be characterized as thin core substrates (that is, substrates having a core with a thickness less than or equal to 400 microns and larger than zero), or no-core substrates (that is, substrates without cores).

Disadvantageously, with a thin or no-core substrate, however, errors may occur during the package manufacturing process, such as, for example, during flip chip bonding where substrate flatness and rigidity are required. To address the above issue, the prior art sometimes provides substrates that may have a thickness of at least several tens of microns or more. However, the above measure disadvantageously detracts from further package size minimization.

The prior art fails to provide method or structures that address the above disadvantages.

BRIEF DESCRIPTION OF THE DRAWINGS

FIGS. 1a and 1b are a schematic, perspective views, respectively, of a top and a bottom of an embodiment of an integrated heat spreader ("IHS") panel including a plurality of IC dies mounted thereon;

FIG. 2a is a schematic, perspective view of the IHS panel of FIGS. 1a and 1b in the process of being mounted to a substrate panel;

FIG. 2b is a schematic, perspective view of the active surface of substrate panel of FIG. 2a;

FIG. 6b is a schematic, a side cross-sectional view through the package of FIG. 6a.

Figure 3:
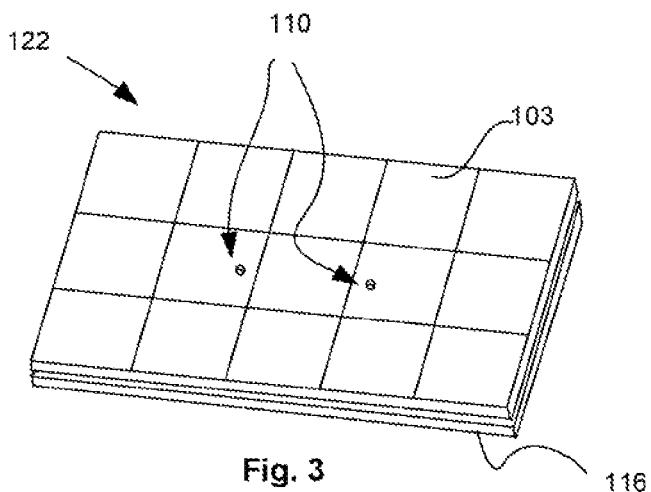
FIG. 3 is a schematic, perspective view of a first combination including the IHS panel and the substrate panel of FIG. 2 after mounting.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements,

DETAILED DESCRIPTION

In the following detailed description, a method of making a microelectronic package, and a microelectronic package made according to the method are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

Aspects of this and other embodiments will be discussed herein with respect to FIGS. 1a, 1b, 2a, 2b, 3-5, 6a, 6b and 7 below. The figures, however, should not be taken to be limiting, as it is intended for the purpose of explanation and understanding. FIGS. 1a, 1b, 2a, 2b and 3-5 represent stages in the making of a microetectronic package according to an embodiment while FIGS. 6a and 6b represent a package made according to the method embodiments shown in FIGS. 1a, 1b, 2a, 2b, and 3-5. The figures will be discussed in further detail below.

Referring first to FIGS. 1a and 1b by way of example, a method embodiment includes bonding and thermally coupling a plurality of IC dies 102 to an IHS (integrated heat spreader) panel 104 to yield a die-carrying IHS panel 103. According to embodiments, the IHS panel may include a copper slug, or may include any other material adapted to be used as a heat spreader material, as would be within the knowledge of a skilled person. The IHS panel 104 may, as shown in the embodiment of FIG. 1b, be pre-notched to define streets 105 therein, the streets contributing to define individual IHS components 106 therebetween (FIG. 1b). Each of the dies 102 may be bonded and thermally coupled to a corresponding one of the IHS components 106 of panel 104 to yield a die-carrying IHS panel 108 as shown. The dies 102 may for example be bonded (that is, mechanically fixed to) and thermally coupled (that is, coupled for enhanced thermal conductivity) to the respective ones of the IHS components 106 using a thermal interface material (TIM), as would be within the knowledge of the skilled person. The IHS panel 104 of the shown embodiments defines ports 110 extending through a thickness thereof, that is, extending from a die-carrying surface 112 of IHS panel 104 all the way to the opposite, backside surface 114 of IHS panel 104.

Referring next to FIGS. 2a, 2b and 3 by way of example, a method embodiment includes mounting the die-carrying IHS panel 103 onto a substrate panel 116 including a plurality of package substrates 118. The package substrates 118 may include any type of package substrate within the knowledge of a skilled person, such as, for example, one of a BGA substrate, a LGA substrate and a PGA substrate. According to one embodiment, the package substrates 118 include at least one of thin substrates and no-core substrates. Boundaries between the individual package substrates 118 are shown by way of broken lines 120 in FIGS. 2a and 2b to suggest that, although the substrate panel 116 may not necessarily have streets pre-notched therein, it nevertheless includes a plurality of individual package substrates 118. Each of the package substrates 118 of the substrate panel 116 may be defined as encompassing a number of electrical connection pads thereon, such as, for example, surface finish pads 121 of FIG. 2b, adapted to be mechanically and electrically bonded to a corresponding one of the IC dies 102 on the die-carrying IHS panel 103, as would be recognized by a skilled person. The die-carrying IHS panel 103 may, according to an embodiment, be for example, flip chip mounted onto the substrate panel 116 using a solder reflow process in a well known manner. A difference here with a prior art reflow process would be that a plurality of dies 102 would be reflowed and thus mounted onto a panel of corresponding package substrates 118 instead of each die being individually reflowed to an individual package substrate. Using a reflow process may include any one of well known techniques, such as, for example, techniques involving use of a thermal compression bonder. In order to effect reflow, solder, such as, for example, solder paste or solder balls, may be provided onto each of the plurality of package substrates 118 of the substrate panel 116 prior to mounting the die-carrying IHS panel onto the substrate panel 116. The solder may be provided for example by way of printing or by way of ball placement mechanisms, or in any other way as would be recognized by one skilled in the art. As seen in FIG. 3 by way of example, according to a method embodiment, mounting each of the plurality of dies 102 to a corresponding one of the plurality of package substrates 118 yields a combination 122 including the die-carrying IHS panel mounted 103 to the substrate panel 116. Preferably, according to embodiments, for mounting the die-carrying IHS panel onto the substrate, either a no-clean flux may be used in a well known manner, or a fluxless process may be used in a well known manner before the die-carrying IHS panel is mounted onto the substrate. A reason for the above is that, given the panel structure of the die-carrying IHS panel and of the substrate panel, it would be preferable not to have to clean the individual substrates on the panel prior to mounting the dies thereon, as doing so may prove structurally difficult. As a result, an embodiment may include a microelectronic package exhibiting no flux residue between the die and the package substrate.

Figure 4:
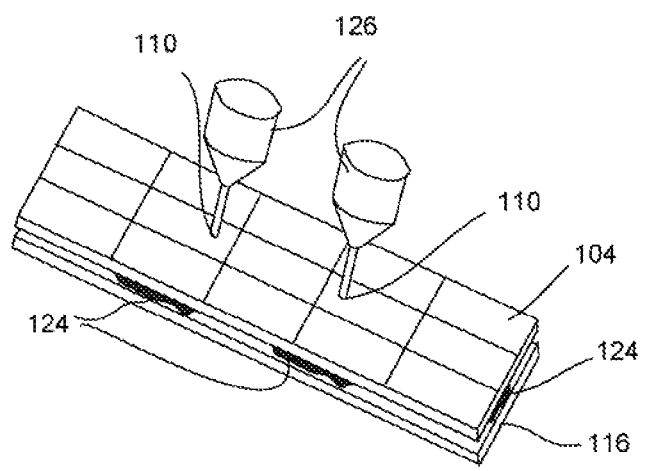
FIG. 4 is a schematic, perspective view of the first combination of FIG. 3 being supplied with underfill material according to an embodiment to yield a second combination including the IHS panel mounted to the substrate panel, and further including underfill material therebetween.

Referring now to FIG. 4 by way of example, a method embodiment includes providing an underfill material 124 in a space between the IHS panel 104 and the substrate panel 116 of the combination 122. Where, as in the case of the shown embodiment, the IHS panel defines a port, such as ports 110, extending through a thickness thereof to provide access to the space between the IHS panel and the substrate panel, the underfill material may be provided through the ports 110, such as by way of underfill dispensers 126 inserted into corresponding ones of the ports 110. Capillary action may then draw the underfill material throughout the space between the IHS panel and the substrate panel. Other manners of providing underfill material between the IHS panel and the substrate panel are within the scope of embodiments, such as, for example, providing underfill material using resin transfer molding, or any other well known technique. Embodiments are further not limited to the use of ports, or to use of only two ports on each panel. Rather, embodiments include within their scope a provision of underfill material in the space between the IHS panel and the substrate panel in any well known manner, and/or through one or more ports, according to application needs. Provision of the underfill material may involve curing the same, as would be recognized by the skilled person.

Figure 5:
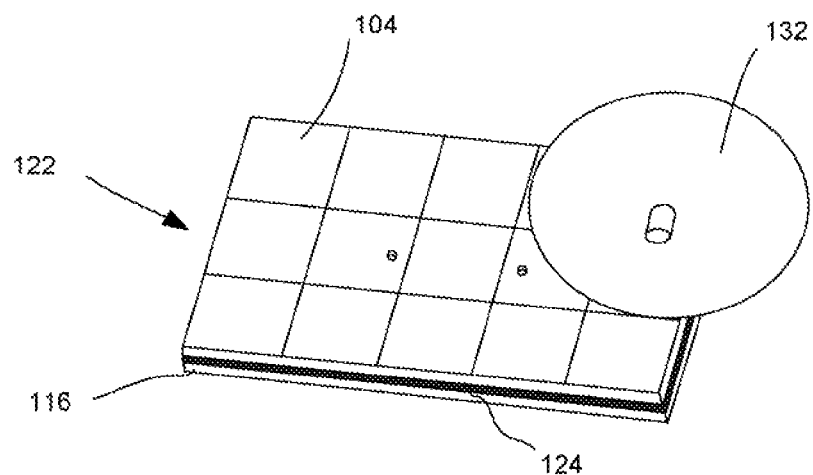
FIG. 5 is a schematic, perspective view of the second combination being singulated according to an embodiment.
Figure 6A:
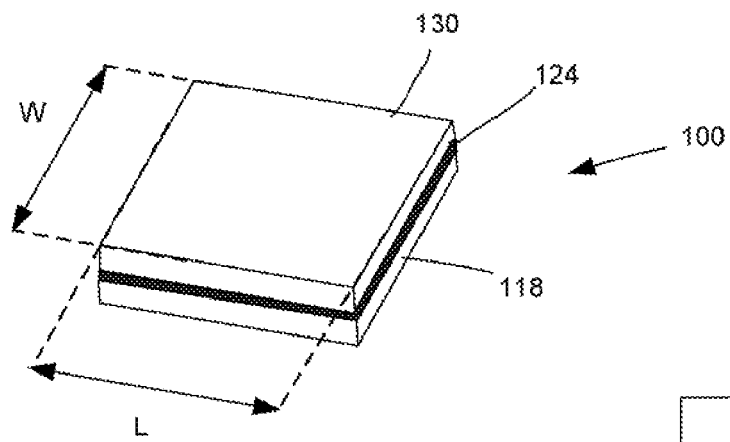
FIG. 6a is a schematic, perspective view of a microelectronic package formed according to the fabrication stages shown in FIGS. 1a-1b and 5.
Figure 6B:
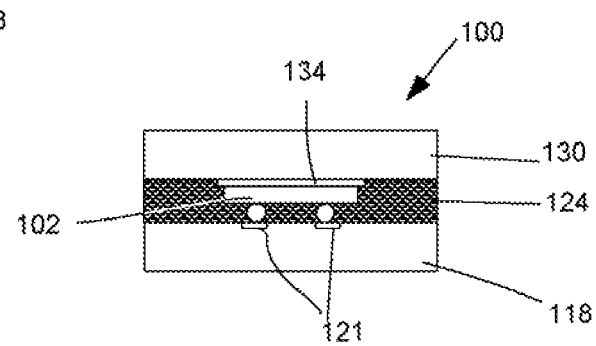

Referring next to FIG. 5 by way of example, a method embodiment includes singulating the combination 122 to yield a plurality of microelectronic packages 128 therefrom. In the embodiment of FIG. 5, the combination 122 further includes the underfill material 124 dispensed in the stage shown in FIG. 4. Singulating may include any one of well known methods for singulating a panel, such as, for example, as shown in FIG. 5, singulating using a saw 132. Other methods of singulating are within the purview of embodiments. Where the IHS panel is pre-notched as shown in FIGS. 1a, 1b, 2a, 2b and 3-5 to define streets 105 therein, singulation may take place along the streets 105 in a well known manner. Singulation according to embodiments yields a plurality of microelectronic packages.

Referring next to FIGS. 6a and 6b, each of the microelectronic packages 100 obtained as explained above in relation to FIGS. 1a, 1b, 2a, 2b and 3-5 may include: an IHS component 130 of the IHS panel 104, one of the plurality IC dies 102 (FIG. 6b), and one of the plurality of package substrates 118, said IHS component 130 and said one of the plurality of IC dies 102 being mounted to said one of the plurality of package substrates 118 to form said each of the packages. In the shown embodiment of FIGS. 6a and 6b, the package 100 also includes the underfill material 124 encompassing the die. In some embodiments, as shown for example in the embodiments depicted in FIGS. 1a, 1b, 2a, 2b, 3-5 and 6a-6b the IHS component 130 of each package 100 is a flat component without any projections extending toward the package substrate. In other words, the IHS component 130 of package 100 of FIGS. 1a, 1b, 2a, 2b, 3-5 and 6a-6b is not in the form of a cap including a flat top surface and walls extending to the package substrate to form an IHS cap on the die. Referring more particularly to the embodiment of the package 100 of FIGS. 6a and 6b the IHS component 130 is bonded and thermally coupled to the die with a TIM 134 (FIG. 6b) such that the die 102 is between the IHS component 130 and the package substrate 118. The IHS component 130 and the underfill material 120 are in turn coextensive in their width W and in their length L (FIG. 6a) with respect to the package substrate 118 by virtue of having been singulated therewith as shown in FIG. 5.

Advantageously, embodiments provide a method of making a microelectronic package using thin or no-core substrates in a cost-effective and reliable manner. Method embodiments contemplate the use of an IHS panel stiffener to which the dies may be initially assembled before the die-carrying IHS panel is then mounted onto a substrate panel. The combination is only thereafter singulated to yield individual microelectronic packages. Thus, embodiments envisage the utilization of two or more dies attached to a heat spreader as a stiffener at the very start of the package assembly process, and the singulation of the combination only at the end of the process line. Advantageously, embodiments enable the elimination of a stiffener or additional complex die or substrate carrier handling media to keep the substrate panel flat. Embodiments further advantageously enable improved and more expedient solder paste printing onto the package substrate and/or the die as a result of an automatic registration of a plurality of package substrates of the substrate panel and/or of a plurality of dies of the die-carrying IHS panel with paste printing material. The use of a substrate panel means that all individual package substrates are aligned with the paste printing equipment, leading to improved precision from pad location to pad location on each individual package substrates. The above advantage enables the use of smaller components since the screen for screen printing may be more accurately located on a substrate panel, in this way avoiding unit to unit tolerances within the carrier. The ability of reduce packing costs for future generation microelectronic packages is a primary focus of the art. Substrates currently represent about 75% of the package cost. Embodiments enable a low cost assembly solution for thin or no-core substrates, which solution is important for meeting projected cost targets. The novel method of attaching two or more dice to a IHS panel or heat slug enables reflowing the C4 joints of the dies to the package substrate using reflow and underfilling for a plurality of dies in one mold shot. The ability to advantageously increase the number of dice assembled and underfilled in one processing stage has a significant ability to reduce processing costs.

Figure 7:
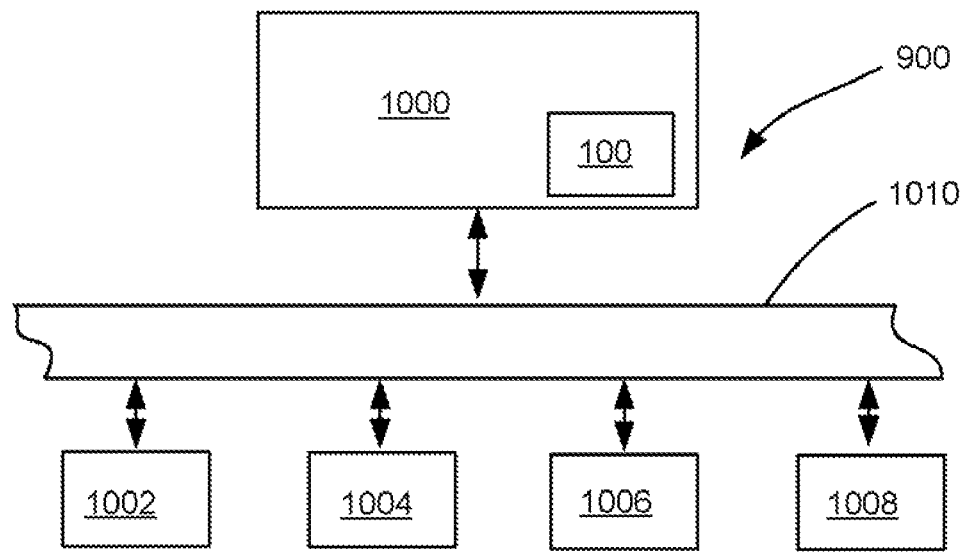
FIG. 7 is a schematic view of an embodiment of a system incorporating a microelectronic package as shown in FIGS. 6a and 6b.

Referring to FIG. 7, there is illustrated one of many possible systems 900 in which embodiments of the present invention may be used. In one embodiment, the electronic assembly 1000 may include a microelectronic package, such as package 100 of FIGS. 6a and 6b. Assembly 1000 may further include a microprocessor. In an alternate embodiment, the electronic assembly 1000 may include an application specific IC (ASIC). Integrated circuits found in chipsets (e.g., graphics sound, and control chipsets) may also be packaged in accordance with embodiments of this invention.

For the embodiment depicted by FIG. 7, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a mediacenter PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A method of making a microelectronic package comprising:

bonding and thermally coupling a plurality of IC dies to an IHS panel to yield a die-carrying IHS panel;

mounting the die-carrying IHS panel onto a substrate panel including a plurality of package substrates by mounting each of the plurality of dies to a corresponding one of the plurality of package substrates to yield a combination including the die-carrying IHS panel mounted to the substrate panel;

singulating the combination to yield a plurality of microelectronic packages, each of the packages including: an IHS component of the IHS panel, one of the plurality IC dies bonded and thermally coupled to said IHS component, and one of the plurality of package substrates, said IHS component and said one of the plurality of IC dies being mounted to said one of the plurality of package substrates to form said each of the packages; and providing an underfill material in a space between the IHS panel and the substrate panel of the combination prior to said singulation of the combination.

2. The method of claim 1, wherein:
the IHS panel defines a port extending through a thickness thereof to provide access to said space between the IHS panel and the substrate panel; and
providing said underfill material includes providing underfill material through the port.

3. The method of claim 1, wherein:
the IHS panel is pre-notched to defines streets therein; and
singulating includes singulating the combination along the streets of the IHS panel to yield IHS components of the packages.

4. The method of claim 1 wherein bonding a plurality of IC dies includes bonding the dies to the IHS panel using a thermal interface material.

5. The method of claim 1, wherein mounting the die-carrying IHS panel onto the substrate panel includes using a solder reflow process.

6. The method of claim 5, wherein using a solder reflow process includes using a thermal compression bonder.

7. The method of claim 5, further comprising providing solder onto pads of each of the plurality of package substrates of the substrate panel prior to mounting the die-carrying IHS panel.

8. The method of claim 1, wherein each one of the plurality of package substrates is one of a BGA substrate, a LGA substrate and a PGA substrate.

9. The method of claim 1, further comprising using either a no-clean flux or a fluxless process on the substrate panel prior to mounting the die-carrying IHS panel thereon.

10. The method of claim 1, wherein said IHS component is a flat component without any projections extending toward the package substrate.

* * * * *